US006432801B1

(12) United States Patent
Lee (10) Patent No.: US 6,432,801 B1
(45) Date of Patent: Aug. 13, 2002

(54) GATE ELECTRODE IN A SEMICONDUCTOR DEVICE AND METHOD FOR FORMING THEREOF

(75) Inventor: Byung Hak Lee, Chungcheongbuk-do (KR)

(73) Assignee: Hyundai Electronics Industries, Co., Ltd., Kyoungki-do (KR)

( * ) Notice: Subject to any disclaimer, the term of this patent is extended or adjusted under 35 U.S.C. 154(b) by 0 days.

(21) Appl. No.: 09/556,817

(22) Filed: Apr. 21, 2000

(30) Foreign Application Priority Data

Apr. 22, 1999 (KR) ............................................. 99/14512

(51) Int. Cl.⁷ .................. H01L 21/3205; H01L 21/4763
(52) U.S. Cl. ........................ 438/585; 438/592; 438/649; 438/653; 438/664; 438/773
(58) Field of Search ................................ 438/585, 592, 438/649, 653, 655, 664, 682, 773, 787

(56) References Cited

U.S. PATENT DOCUMENTS

| | | | | |
|---|---|---|---|---|
| 5,717,253 A | * | 2/1998 | Shin et al. | 257/754 |
| 5,763,923 A | * | 6/1998 | Hu et al. | 257/382 |
| 5,877,074 A | * | 3/1999 | Jeng et al. | 438/592 |
| 5,888,588 A | * | 3/1999 | Nagabushnam et al. | 427/248.1 |
| 5,923,999 A | * | 7/1999 | Balasubramanyam et al. | 438/592 |
| 5,962,904 A | * | 10/1999 | Hu | 257/412 |
| 6,001,718 A | * | 12/1999 | Katata et al. | 438/592 |
| 6,004,869 A | * | 12/1999 | Hu | 438/585 |
| 6,277,736 B1 | * | 8/2001 | Chen et al. | 438/653 |
| 6,291,868 B1 | * | 9/2001 | Weimer et al. | 257/413 |
| 2001/0005622 A1 | * | 6/2001 | Kim et al. | 438/592 |

FOREIGN PATENT DOCUMENTS

JP 02000196083 A1 * 7/2000 ............ H01L/29/78

OTHER PUBLICATIONS

Bae et al., VMIC Conference, 106/96/0521(c), pp. 521–523 (1996).

* cited by examiner

Primary Examiner—John F. Niebling
Assistant Examiner—Toniae M Thomas
(74) Attorney, Agent, or Firm—Birch, Stewart, Kolasch & Birch, LLP

(57) ABSTRACT

The present invention relates to a method for forming a gate electrode in a semiconductor device, which can improve GOI characteristics and allows for an effective suppression of metal silicide spike formation. This method includes the steps of forming a gate insulating film over a semiconductor substrate, forming a first semiconductor layer over the gate insulating film, forming a barrier layer over the first semiconductor layer to prevent formation of metal silicide spikes in the first semiconductor layer, forming a second semiconductor layer over the barrier layer, and forming a metal silicide layer over the second semiconductor layer.

15 Claims, 7 Drawing Sheets

GATE ELECTRODE IN A SEMICONDUCTOR DEVICE AND METHOD FOR FORMING THEREOF

BACKGROUND OF THE INVENTION

1. Field of the Invention

The present invention relates to a gate electrode in a semiconductor device with improved Gate Oxide Integration (GOI) characteristics and in which spike formation has been suppressed.

The present invention also relates to formation of metal wiring in a semiconductor device and, more particularly, to a method for forming a gate electrode in a semiconductor device which can improve GOI characteristics and effectively suppress spike formation.

2. Background of the Related Art

A related art method for forming metal wiring will be explained with reference to the attached drawings. FIGS. 1a to 1g illustrate the steps of a related art method for forming a gate electrode.

Figure 1A:
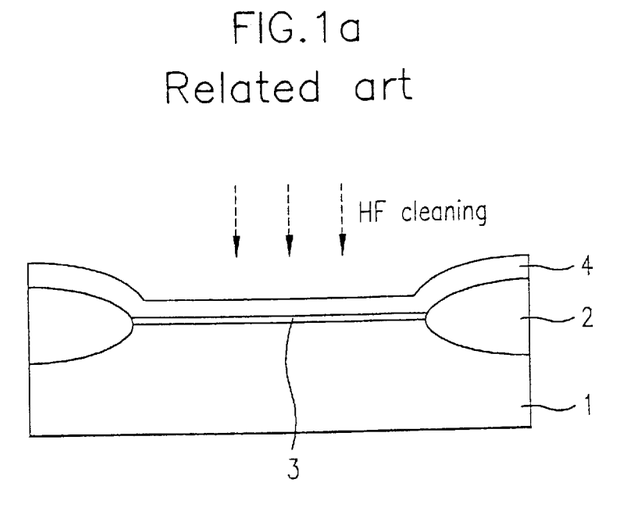
FIGS. 1a to 1g illustrate the steps of a related art method for forming a gate electrode in a semiconductor device.

Referring to FIG. 1a, a gate insulating film 3 is formed on the surface of a semiconductor substrate 1 having an active region defined thereon by a field oxide film 2 grown to a thickness of 60 Å by thermal oxidation. Then, a 1000 Å-thick doped polysilicon layer 4 is formed on the gate insulating film 3 and field oxide film 2 by Low Pressure Chemical Vapor Deposition (LPCVD). An HF solution is then used to remove oxides on the surface of the doped polysilicon layer 4.

Figure 1B:
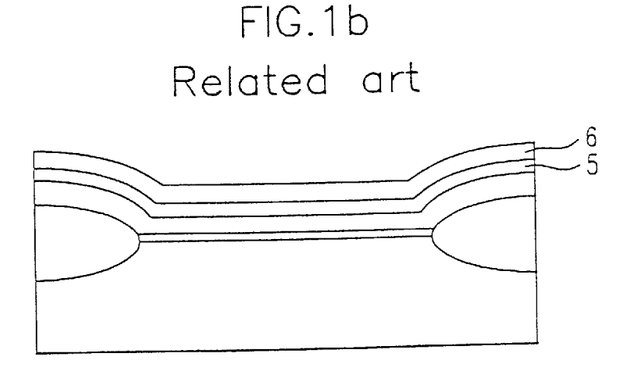
Figure 1C:
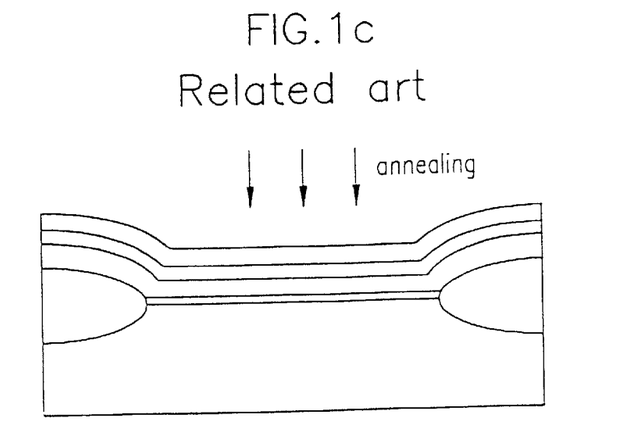

Then, as shown in FIG. 1b, a 100 Å-thick TiN layer 5 and a 1000 Å-thick $TiSi_x$ layer 6 are formed by sputtering and, as shown in FIG. 1c, subjected to annealing at a temperature ranging from 800 to 900° C. for 30 minutes under an Ar or $N_2$ atmosphere. The annealing transforms the $TiSi_x$ layer 6 from the C49 phase, which has a high resistivity, into the C54 phase, thereby dropping the resistivity below 20 $\mu\Omega$/cm.

Figure 1D:
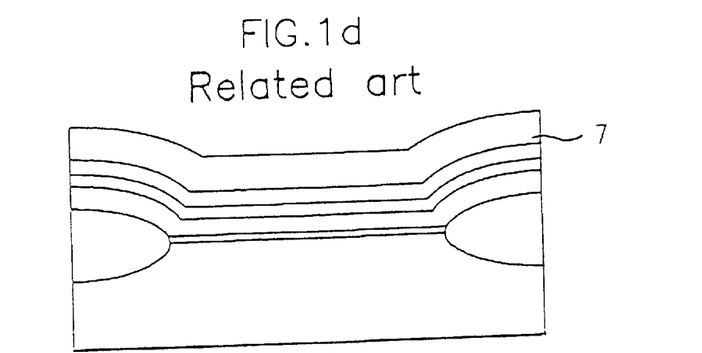
Figure 1E:
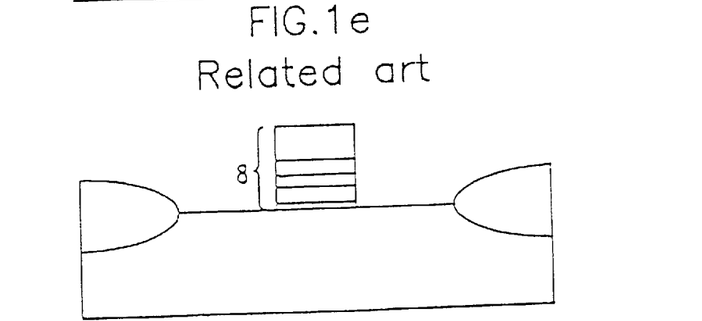

As shown in FIG. 1d, a first insulating layer 7 is formed to a thickness of 2500 Å on the $TiSi_x$ layer 6. As shown in FIG. 1e, a stack of the first insulating layer 7, the $TiSi_x$ layer 6, the TiN layer 5, the doped polysilicon layer 4 and the gate insulating film 3 are selectively patterned to form a gate electrode 8.

Figure 1F:
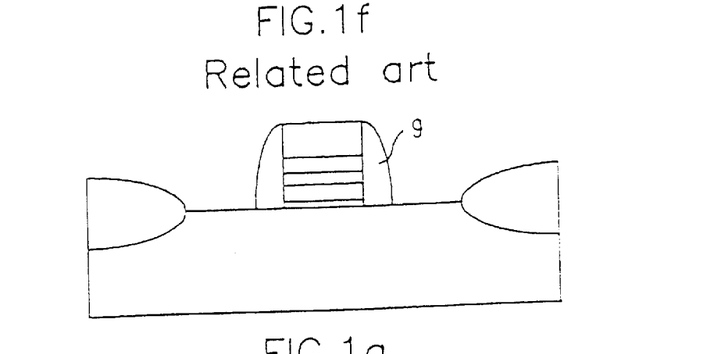
Figure 1G:
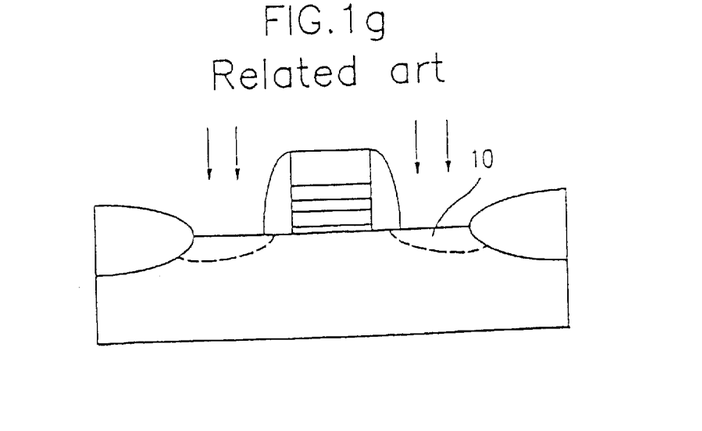

Referring to FIG. 1f, a 500 Å-thick second insulating film (not shown) is formed on the entire exposed surface, including the gate electrode 8, and is etched back to form gate sidewalls 9 at both sides of the gate electrode 8. As shown in FIG. 1g, the gate electrode 8, inclusive of the gate sidewalls 9, is used as a mask in conducting impurity ion injection and diffusion to form source/drain regions 10. In this related art method for forming metal wiring in a semiconductor device, the Si/Ti ratio selected for sputtering the $TiSi_x$ layer 6 is between 2.1 and 2.3, in order to drop the resistivity and to reduce particle formation during deposition.

However, this related art method for forming metal wiring in a semiconductor device has the following problem:

Subsequent re-oxidation, that eliminates the damage done to the gate insulating film 3 during patterning of the gate electrode 8, forms $TiSi_x$ spikes in the doped polysilicon layer 4 due to diffusion of Ti through grain boundaries of the doped polysilicon layer 4. Si from the doped polysilicon layer 4 is consumed during the re-oxidation, causing rapid deterioration of gate line resistance and GOI characteristics. In order to prevent this, a Ti polycide of a $TiSi_x$/TiN/poly-Si structure is suggested. However, because the TiN in the $TiSi_x$/TiN/poly-Si is susceptible to oxidation, $TiSi_x$/$TiO_x$/poly-Si forms after the re-oxidation. As a result, contact resistance between the $TiSi_x$ layer 6 and poly-Si layer 4 increases and GOI characteristics drop sharply. Thus, an effective application of re-oxidation to the related art method for forming metal wiring in a semiconductor device is impeded.

SUMMARY OF THE INVENTION

Accordingly, the present invention is directed to a method for forming a gate electrode in a semiconductor device that substantially obviates one or more of the problems due to limitations and disadvantages of the related art.

An object of the present invention is to provide a method for forming a gate electrode in a semiconductor device which can improve GOI characteristics and that allows an effective suppression of spike formation.

Additional features and advantages of the present invention will be set forth in the description which follows and, in part, will be apparent from the description, or may be learned by practice of the present invention. The objectives and other advantages of the present invention will be realized and attained by the structure particularly pointed out in the written description and claims hereof as well as in the appended drawings.

To achieve these and other advantages and in accordance with the purpose of the present invention, as embodied and broadly described, the method for forming a gate electrode in a semiconductor device includes the steps of: forming a gate insulating film over a semiconductor substrate, forming a first semiconductor layer over the gate insulating film, forming a barrier layer over the first semiconductor layer to prevent formation of metal silicide spikes in the first semiconductor layer, forming a second semiconductor layer over the barrier layer, and forming a metal silicide layer over the second semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are hereby incorporated in and constitute a part of this specification, illustrate embodiments of the invention and, together with the specification, serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 2A:
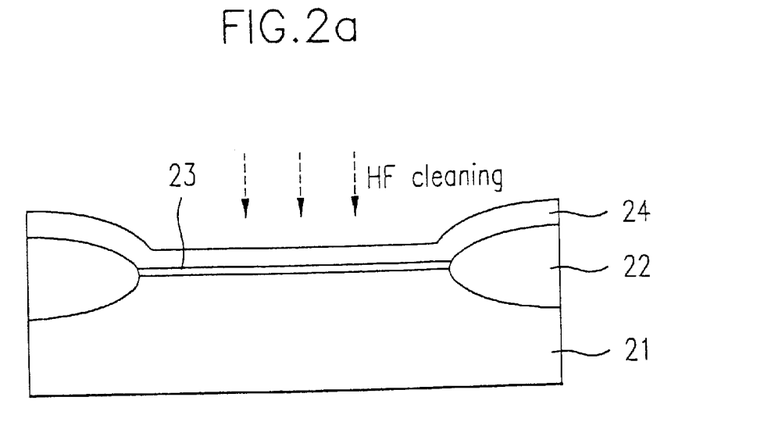
FIGS. 2a to 2i illustrate the steps of a method for forming a gate electrode in a semiconductor device in accordance with a preferred embodiment of the present invention; and, FIG. 3 illustrates a graph showing selective oxidation characteristics of a gate electrode of the present invention.

Referring to FIG. 2a, the method starts with the formation of a gate insulating film 23 by thermal oxidation to a thickness of 50 to 70 Å, for example 60 Å, on the surface of a semiconductor substrate 21 having an active region defined by a device isolation layer 22. A first semiconductor layer 24 of, for example, a doped polysilicon, is formed on the gate insulating film 23 and device isolation layer 22 to a thickness of between 500 and 1000 Å by LPCVD, during which a dopant can be injected into the first semiconductor layer 24. For example, Si deposited using $SiH_4$ or $Si_2H_6$ as a source gas can be doped by adding a source gas including P, B or As during the LPCVD process. An HF solution is then used to remove oxide on the surface of the first semiconductor layer 24.

Figure 2B:
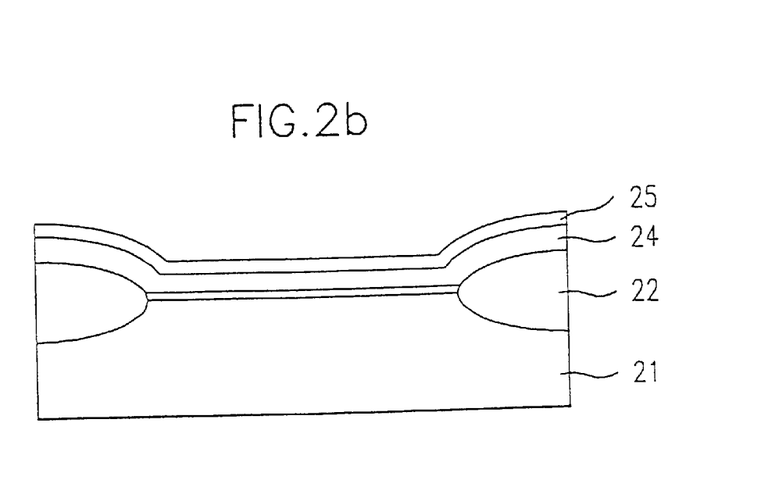

Then, as shown in FIG. 2b, a nitride metal layer 25 is deposited on the first semiconductor layer 24 to a thickness ranging from 90 to 110 Å, for example 100 Å, for use as a barrier which is not oxidized in a subsequent selective oxidation and prevents formation of metal silicide layer spikes, for example $TiSi_x$ spikes, within the first semiconductor layer 24. The nitride metal layer 25 may be formed of $WN_x$ or $MoN_x$, and suppresses dopant depletion in the first semiconductor layer 24 during a subsequent thermal process. To ensure its being amorphous, the $WN_x$ or $MoN_x$ of the barrier is deposited by reactive sputtering or Plasma Enhanced Chemical Vapor Deposition (PECVD) using a source gas including W and N or Mo and N and having an N content of between 10 and 45%.

Figure 2C:
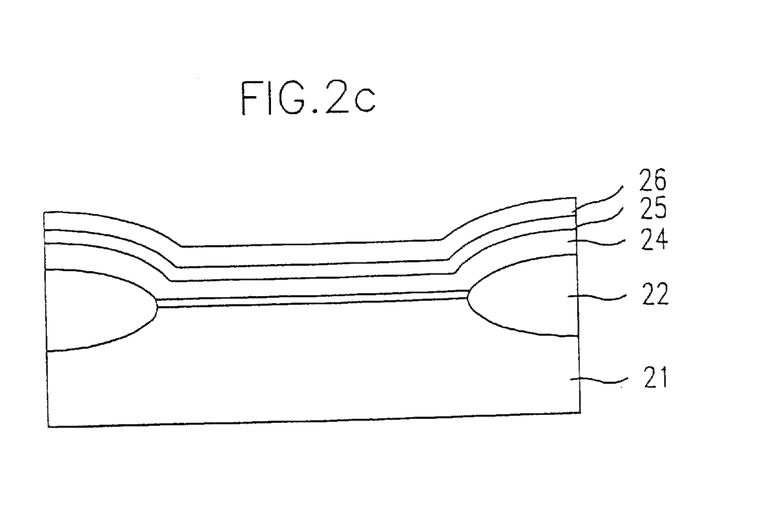

As shown in FIG. 2c, a second semiconductor layer 26, for example of amorphous silicon, is deposited on the nitride metal layer 25 to a thickness of between 100 and 200 Å. The second semiconductor layer 26 feeds Si to the subsequently deposited metal silicide layer 27, for example a $TiSi_x$ layer, during the subsequent selective oxidation, to prevent formation of metal silicide spikes through grain boundaries of the first semiconductor layer 24. The second semiconductor layer 26 can be deposited at a temperature below 600° C. by LPCVD using $SiH_4$ or $Si_2H_6$ as a source gas.

Figure 2D:
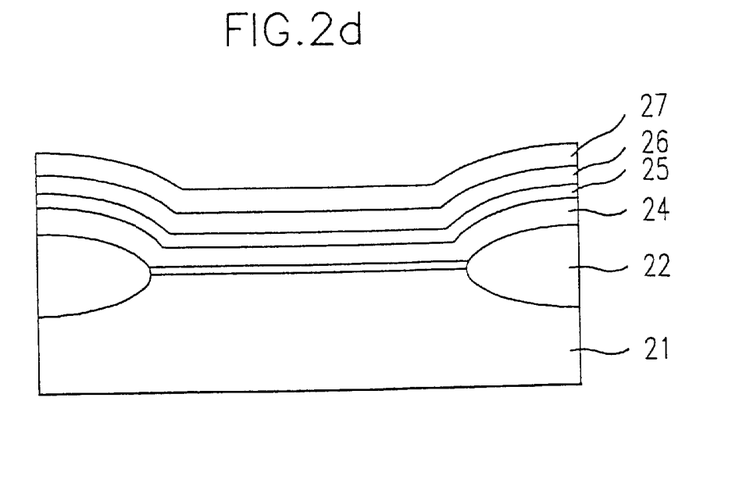

Then, as shown in FIG. 2d, a metal silicide layer 27 with a thickness ranging from 900 to 1100 Å, for example a 1000 Å-thick $TiSi_x$ layer, is deposited on the second semiconductor layer 26. In the case of $TiSi_x$, the metal silicide layer 27 has an Si/Ti ratio of between 2.1 and 2.3 and a resistivity of below 20 $\mu\Omega$/cm after being annealed at a temperature higher than 800° C.

Figure 2E:
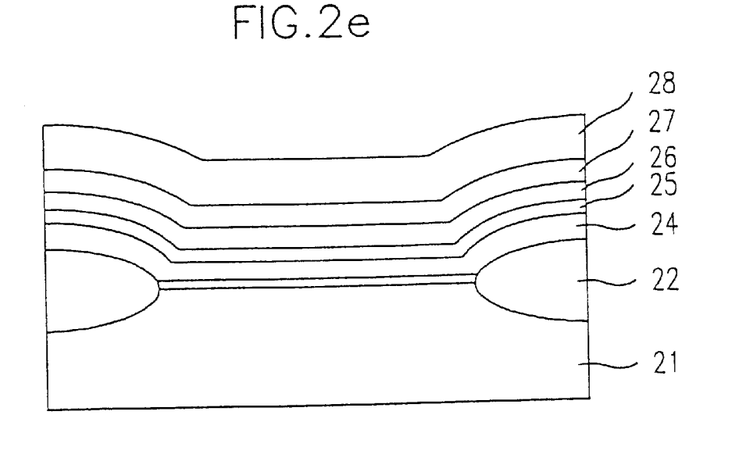

As shown in FIG. 2e, a first insulating layer 28 is formed on the metal silicide layer 27 to a thickness ranging from 2300 to 2700 Å, for example 2500 Å.

Figure 2F:
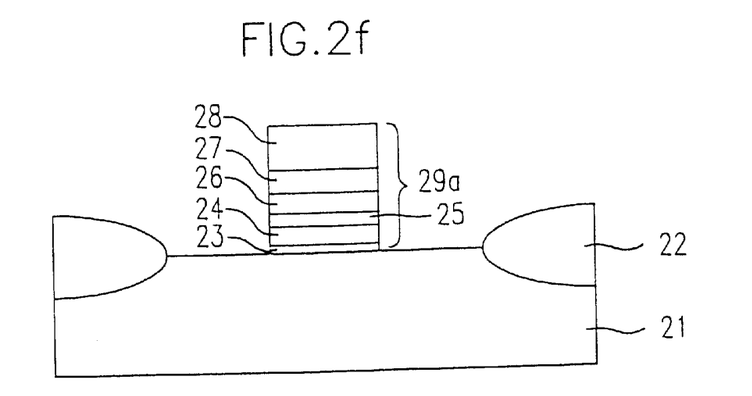

As shown in FIG. 2f, a stack of the first insulating layer 28, the metal silicide layer 27, the second semiconductor layer 26, the nitride metal layer 25, the first semiconductor layer 24, and the gate insulating film 23 are selectively etched to form a gate electrode 29a. The gate electrode 29a shown in FIG. 2f is a gate electrode before selective oxidation.

Figure 2G:
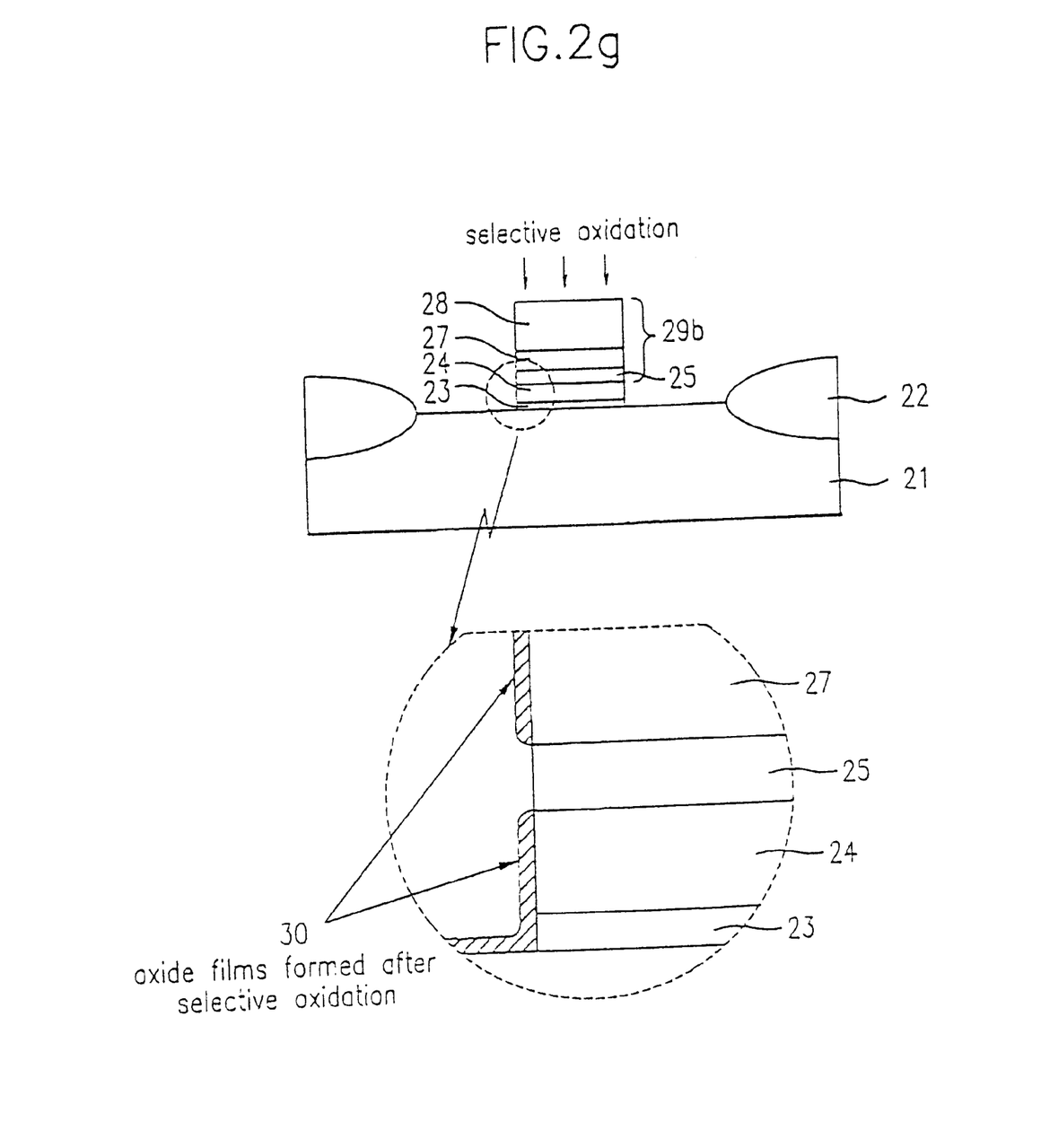

As shown in FIG. 2g, the metal silicide layer 27, the first semiconductor layer 24 and the semiconductor substrate 21 are selectively oxidized under an $H_2O/(H_2/N_2)$ atmosphere, at between 800 and 1000° C. under between 100 and 760 torr for between 1 and 30 minutes under an $H_2O/(H_2/N_2)$ partial pressure ratio set to between $10^{-6}$ and 1 to restore etch damage done to the gate insulating film 23. In the aforementioned selective oxidation, a resistance drop, caused by annealing of the metal silicide layer 27, and an oxide film growth, caused by feeding Si from the second semiconductor layer 26 to the surface of the metal silicide layer 27, are done at the same time and lead to the second semiconductor layer 26 no longer being present after the selective oxidation. The gate electrode 29b in FIG. 2g is a gate electrode after the selective oxidation.

As shown in an enlarged view in FIG. 2g, the nitride metal layer 25 acts as a barrier in the selective oxidation and prevents formation of metal silicide spikes in the first semiconductor layer 24. Also shown in FIG. 2g is the formation of an oxide film 30 on the metal silicide layer 27, the first semiconductor layer 24, the gate insulating film 23, and the semiconductor substrate 21.

The nitride metal layer 25 can be utilized as a barrier in the selective oxidation because of the following reasons:

An equilibrium reaction expression of oxidation in a wet hydrogen atmosphere is $K (P_{H2/N2}/P_{H20})^3$, and the same in an oxygen atmosphere is $K (P_{O2})^3$, where K is a reaction equilibrium constant, $P_{H2/N2}$ and $P_{H20}$ are partial pressures of $H_2/N_2$ and $H_2O$ respectively, and $P_{O2}$ is a partial pressure of oxygen. The reaction formula of an oxidation of the metal nitride film in a wet hydrogen atmosphere is $WN_x + 3H_2O \leftrightarrows WO_3 + 3H_2\uparrow + N_2\uparrow + O_2\uparrow + O^-$, and the reaction formula of oxidation of silicon in the wet hydrogen atmosphere is $Si + 2H_2O\uparrow SiO_2 + 2H_2\uparrow$. The reaction formula of an oxidation of the metal nitride film in an oxygen atmosphere is $WN_x + 3O_2\uparrow WO_3 + N_2\uparrow + O_2\uparrow + O^-$, and the reaction formula of oxidation of silicon in an oxygen atmosphere is $Si + 2H_2O\uparrow SiO_2 + 2H_2\uparrow$. In the case of the oxidation reaction of the metal nitride film, $WN_x + 3H_2O\uparrow WO_3 + 3H_2\uparrow + N_2\uparrow + O_2\uparrow + O^-$, as $WN_x$ and $H_2O$ make either a forward or a reverse reaction, depending on the partial pressure of hydrogen, the hydrogen partial pressure is regulated to prevent the oxidation of $WN_x$. However, regulation of oxidation of $WN_x + 3O_2\uparrow WO_3 + N_2\uparrow + O_2\uparrow + O^-$ is very difficult in an oxygen atmosphere.

Figure 2H:
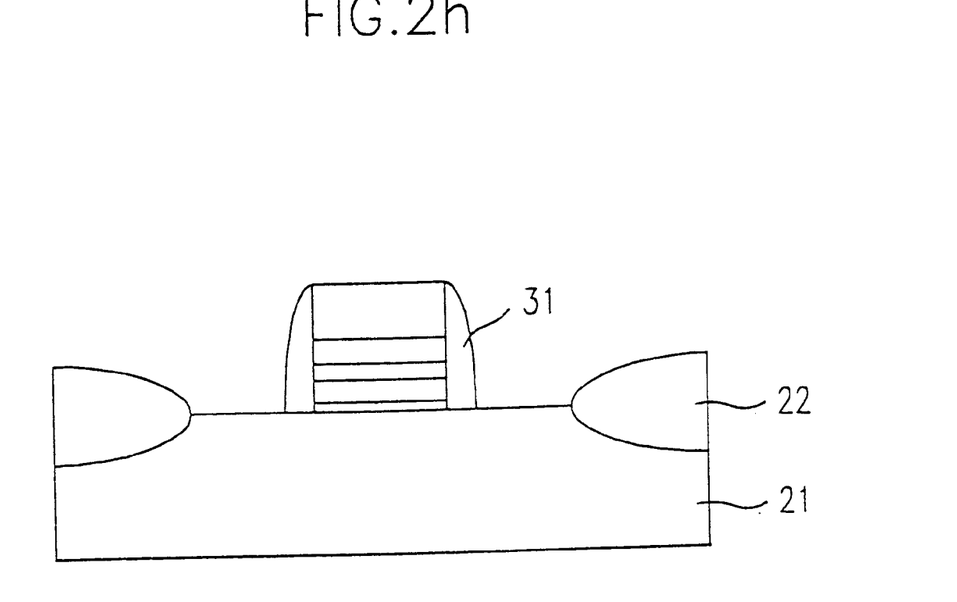
Figure 2I:
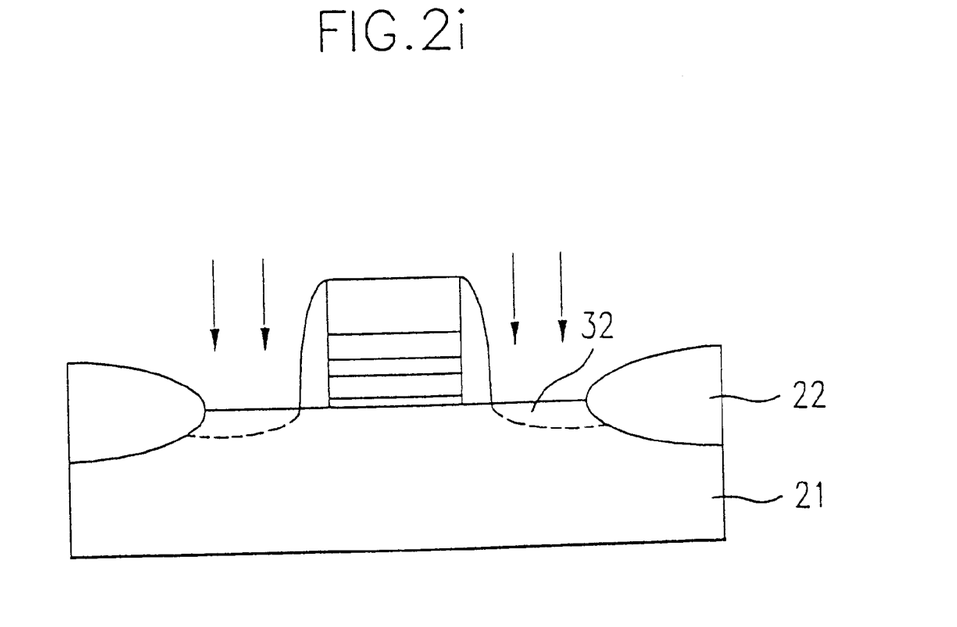

Referring to FIG. 2h, a second insulating layer (not shown) is formed on the entire surface of the gate electrode 29b after the selective oxidation to a thickness of 450 to 550 Å, for example 500 Å, and is etched back to form gate sidewalls 31 at both sides of the gate electrode 29b. As shown in FIG. 2i, the gate electrode 29b, inclusive of the gate sidewalls 31, after the selective oxidation, is used as a mask in conducting impurity ion injection and diffusion to form source/drain regions 32.

Figure 3:
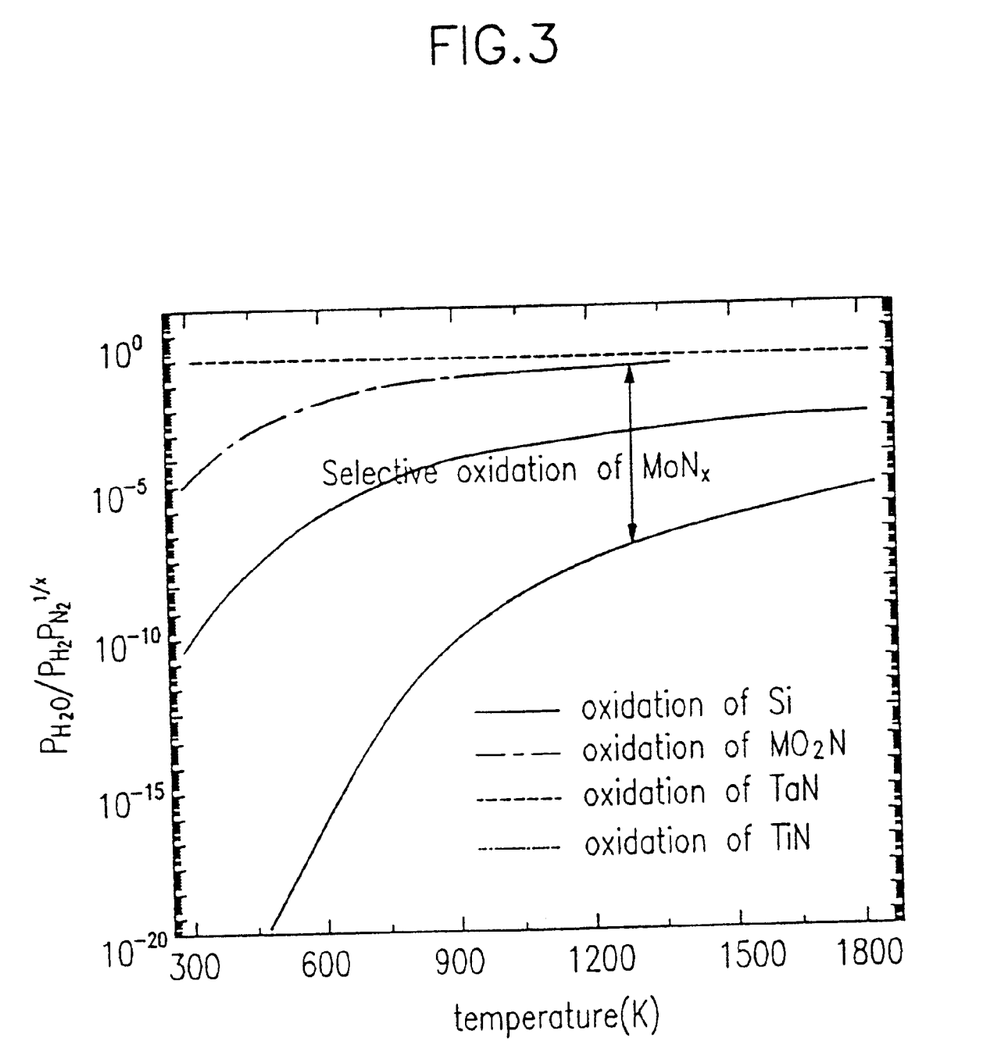

The method of the present invention for forming a gate electrode in a semiconductor device facilitates selective oxidation after a gate electrode is patterned, utilizing a difference of equilibrium $H_2O/H_2$ partial pressure ratios for Si and the barrier as shown in FIG. 3. FIG. 3 illustrates the existence of a process region in which oxidation of the barrier does not occur through oxidation of the Si. Instead, it occurs due to the difference of equilibrium $H_2O/H_2$ partial pressure ratios during the wet hydrogen oxidation. As shown in FIG. 3, if materials such as TiN or TaN are used, the barrier shows a process region which permits selective oxidation only if the equilibrium $H_2O/H_2$ partial pressure ratio is regulated to be below $10^{-3}$. Hence, these materials can not be applied to practical semiconductor device fabrication processes.

The method for forming a gate electrode in a semiconductor device of the present invention employs $WN_x$ or $MoN_x$, both of which permit regulation of the equilibrium $H_2O/H_2$ partial pressure ratio to be from below $10^{-6}$ to 1, allowing them to function as barrier materials for facilitating selective oxidation. The method of the present invention for forming a gate electrode in a semiconductor device also uses a metal silicide layer, typically a $TiSi_x$ layer with an Si/Ti ratio of 2.1 to 2.3, for reducing the particle formation problem and lowering resistance. Because Si in the metal silicide is consumed in the oxidation of the metal silicide/TiN/poly-Si structure, which forms an $SiO_2$ film on the surface of the metal silicide surface, it is essential that additional Si be fed to prevent irregular oxidation. In the present invention, an amorphous silicon layer is formed under the metal silicide thin film for feeding the silicon required during oxidation.

As has been explained, the method of the present invention for forming a gate electrode in a semiconductor device has the following advantages:

An effective restoration of a gate insulating film damaged from etching is permitted by facilitating selective oxidation using $WN_x$ or $MoN_x$ as a barrier, which permits regulation of the equilibrium $H_2O/(H_2/N_2)$ partial pressure ratio to be from below $10^{-6}$ to 1. Also, the use of amorphous $WN_x$ or $MoN_x$ as a barrier can effectively suppress metal silicide spike formation caused by metal diffusion during a subsequent thermal process. The make-up of Si consumed in the selective oxidation from the second semiconductor layer 26 under the metal silicide layer 27 suppresses formation of metal-rich silicide which is a cause of irregular oxidation. The aforementioned advantages imply that a gate of a Ti-polycide structure with a low resistance and excellent GOI characteristics, that allows application to a DRAM gate structure over the 256M class, can be obtained.

It should be apparent to those skilled in the art that various modifications and variations can be made in the method for forming a gate electrode in a semiconductor device of the present invention without departing from the spirit or scope of the invention. Thus, it is intended that the present invention cover the modifications and variations of this invention provided they come within the scope of the appended claims and their equivalents.

What is claimed:

1. A method for forming a gate electrode, comprising the steps of:

forming a gate insulating film over a semiconductor substrate;

forming a first semiconductor layer over the gate insulating film;

forming a barrier layer over the first semiconductor layer to prevent formation of metal silicide spikes in the first semiconductor layer;

forming a second semiconductor layer over the barrier layer; and forming a metal silicide layer over the second semiconductor layer.

2. The method of claim 1, wherein the barrier layer comprises a nitride metal layer.

3. The method of claim 2, wherein the forming a nitride metal layer step comprises depositing an amorphous $WN_x$ or $MoN_x$ layer.

4. The method of claim 3, wherein the forming a nitride metal layer step forms the nitride metal layer via a PECVD process using a source gas comprising W and N or Mo and N with a nitrogen content of between 10% and 45%.

5. The method of claim 1, wherein the semiconductor substrate comprises at least one active region defined by a device isolation layer.

6. The method of claim 1, wherein the forming a second semiconductor layer forms the second semiconductor layer via an LPCVD process carried out at below 600° C. using at least one of $SiH_4$ and $Si_2H_6$ as a source gas.

7. The method of claim 1, wherein the forming a first semiconductor layer step forms the first semiconductor layer via an LPCVD process using at least one source gas chosen from the group consisting of $SiH_4$ and $Si_2H_6$.

8. The method of claim 7, wherein the LPCVD process further comprises using a dopant gas comprising at least one element chosen from the group consisting of P, B and As.

9. A method for forming a gate electrode, comprising the steps of:

forming a gate insulating film over a semiconductor substrate;

forming a first semiconductor layer over the gate insulating film;

forming a barrier layer over the first semiconductor layer to prevent formation of metal silicide spikes in the first semiconductor layer;

forming a second semiconductor layer over the barrier layer; and forming a metal silicide layer over the second semiconductor layer;

selectively oxidizing the metal silicide layer, the first semiconductor layer, the gate insulating film and the substrate under a wet hydrogen atmosphere.

10. The method of claim 9, further comprising:

forming a first insulation layer over the metal suicide layer;

selectively etching the first insulation layer, the metal silicide layer, the second semiconductor layer, the nitride metal layer, the first semiconductor layer and the gate insulating film to form a gate electrode;

forming a second insulation layer over the surface exposed after the selectively etching step and the selectively oxidizing step;

etching the second insulation layer to form gate sidewalls on sides of the gate electrode;

injecting impurity ions using the gate electrode, including the gate sidewalls, as a mask; and diffusing the impurity ions to form source/drain regions.

11. The method of claim 9, wherein the selectively oxidizing step comprises selective oxidation under an $H_2O/(H_2/N_2)$ atmosphere.

12. The method of claim 11, wherein the selective oxidation is carried out at between 800 and 1000° C. under a pressure of between 100 and 760 torr and for between 1 and 30 minutes with a $H_2O/(H_2/N_2)$ partial pressure ratio of between $10^{-6}$ and 1.

13. A method for forming a gate electrode, comprising the steps of:

forming a gate insulating film over a semiconductor substrate;

forming a first semiconductor layer over the gate insulating film;

forming a barrier layer over the first semiconductor layer to prevent formation of metal silicide spikes in the first semiconductor layer;

forming a second semiconductor layer over the barrier layer; and forming a $TiSi_x$ layer over the second semiconductor layer.

14. The method of claim 13, wherein the $TiSi_x$ layer comprises an Si/Ti ratio of between 2.1 and 2.3.

15. The method of claim 13, wherein the $TiSi_x$ layer has a resistivity of below 20 $\mu\Omega$/cm after annealing at a temperature of at least 800° C.

* * * * *